(12) United States Patent
Kim et al.

(10) Patent No.: US 9,601,666 B2
(45) Date of Patent: *Mar. 21, 2017

(54) LIGHT EMITTING DEVICE

(71) Applicant: LG INNOTEK CO., LTD., Seoul (KR)

(72) Inventors: Sung Kyoon Kim, Seoul (KR); Hee Young Beom, Seoul (KR); Hyun Seoung Ju, Seoul (KR); Byung Yeon Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/007,723

(22) Filed: Jan. 27, 2016

(65) Prior Publication Data

US 2016/0225954 A1    Aug. 4, 2016

Related U.S. Application Data

(63) Continuation of application No. 14/072,070, filed on Nov. 5, 2013, now Pat. No. 9,281,449.

(30) Foreign Application Priority Data

Nov. 9, 2012    (KR) ........................ 10-2012-0126523

(51) Int. Cl.
*H01L 27/15*    (2006.01)
*H01L 33/62*    (2010.01)
(Continued)

(52) U.S. Cl.
CPC ............ *H01L 33/38* (2013.01); *H01L 27/156* (2013.01); *H01L 33/06* (2013.01); *H01L 33/385* (2013.01);
(Continued)

(58) Field of Classification Search
None
See application file for complete search history.

(56) References Cited

U.S. PATENT DOCUMENTS

2008/0185606 A1    8/2008  Sano et al.

2009/0322241 A1    12/2009  Onushkin et al.
(Continued)

FOREIGN PATENT DOCUMENTS

EP    2 362 420 A1    8/2011

OTHER PUBLICATIONS

U.S. Office Action for parent U.S. Appl. No. 14/072,070 dated Jan. 2, 2015.
(Continued)

*Primary Examiner* — Johannes P Mondt
(74) *Attorney, Agent, or Firm* — Ked & Associates LLP

(57) ABSTRACT

A light emitting device includes a substrate, a plurality of light emitting cells separated from each other and disposed on the substrate, and a plurality of conductive interconnection layers electrically connecting two neighboring light emitting cells. Each light emitting cell includes a light emitting structure including a first conductivity-type semiconductor layer, an active layer and a second conductivity-type semiconductor layer, a first electrode, a second electrode, and an etching area. The light emitting structure further includes a first side surface and a second side surface, and if a width between the first side surface and the second side surface is defined as W, the second electrode is disposed in an area between a position separated from the first side surface by $$\frac{1}{5}W$$

and a position separated from the first side surface of the light emitting structure by $$\frac{1}{2}W.$$

20 Claims, 10 Drawing Sheets

(51) Int. Cl.
H01L 33/38 (2010.01)
H01L 33/06 (2010.01)
H01L 33/20 (2010.01)

(52) U.S. Cl.
CPC .............. H01L 33/62 (2013.01); *H01L 33/20* (2013.01); *H01L 2224/48091* (2013.01); *H01L 2224/48247* (2013.01)

(56) References Cited

U.S. PATENT DOCUMENTS

| | | |
|---|---|---|
| 2010/0052494 A1 | 3/2010 | Feng et al. |
| 2010/0289041 A1* | 11/2010 | Shakuda ............... H01L 33/385 257/93 |
| 2011/0089442 A1 | 4/2011 | Jing et al. |
| 2011/0210351 A1 | 9/2011 | Kim et al. |
| 2012/0085986 A1 | 4/2012 | Iwanaga et al. |
| 2012/0097993 A1 | 4/2012 | Chen |
| 2012/0187424 A1* | 7/2012 | Kim ...................... H01L 27/156 257/88 |
| 2012/0187431 A1 | 7/2012 | Bergmann et al. |

OTHER PUBLICATIONS

U.S. Office Action for parent U.S. Appl. No. 14/072,070 dated Jul. 28, 2015.
Extended European Search Report for Application 13192161.1 dated Dec. 9, 2015.

\* cited by examiner

LIGHT EMITTING DEVICE

CROSS REFERENCE TO RELATED APPLICATION

This application is a continuation application of U.S. patent application Ser. No. 14/072,070, filed Nov. 5, 2013, which claims priority under 35 U.S.C. §119 to Korean Patent Application No. 10-2012-0126523, filed in Korea on Nov. 9, 2012, which are hereby incorporated herein by reference.

BACKGROUND

1. Field

Embodiments relate to a light emitting device.

2. Background

Light emitting devices, such as light emitting diodes or laser diodes using group III-V or II-VI compound semiconductor materials, generate light of various colors, such as red, green, blue, and ultraviolet light, due to development of thin film growth techniques and device materials, and generate white light having high efficiency using fluorescent materials or through color mixing. Further, light emitting devices exhibit low power consumption, semipermanent lifespan, fast response time, safety, and eco-friendliness, as compared to conventional light sources, such as fluorescent lamps and incandescent lamps.

Therefore, light emitting devices are increasingly applied to transmission modules of optical communication units, light emitting diode backlights substituting for cold cathode fluorescent lamps (CCFLs) constituting backlights of liquid crystal display (LCD) devices, lighting apparatuses using white light emitting diodes substituting for fluorescent lamps or incandescent lamps, head lights for vehicles, and traffic lights.

In case of a horizontal type light emitting device, a light emitting structure including an n-GaN layer, an active layer, and a p-GaN layer is generally stacked on a sapphire substrate. Due to characteristics of the horizontal type light emitting device, an n-electrode and a p-electrode are horizontally formed and may cause high current spreading resistance. Such a problem occurs even in a light emitting device in which plural light emitting cells are connected in series or in parallel. Therefore, in order to enhance current spreading, the positions of the n-electrode and the p-electrode need to be optimized.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Figure 1:
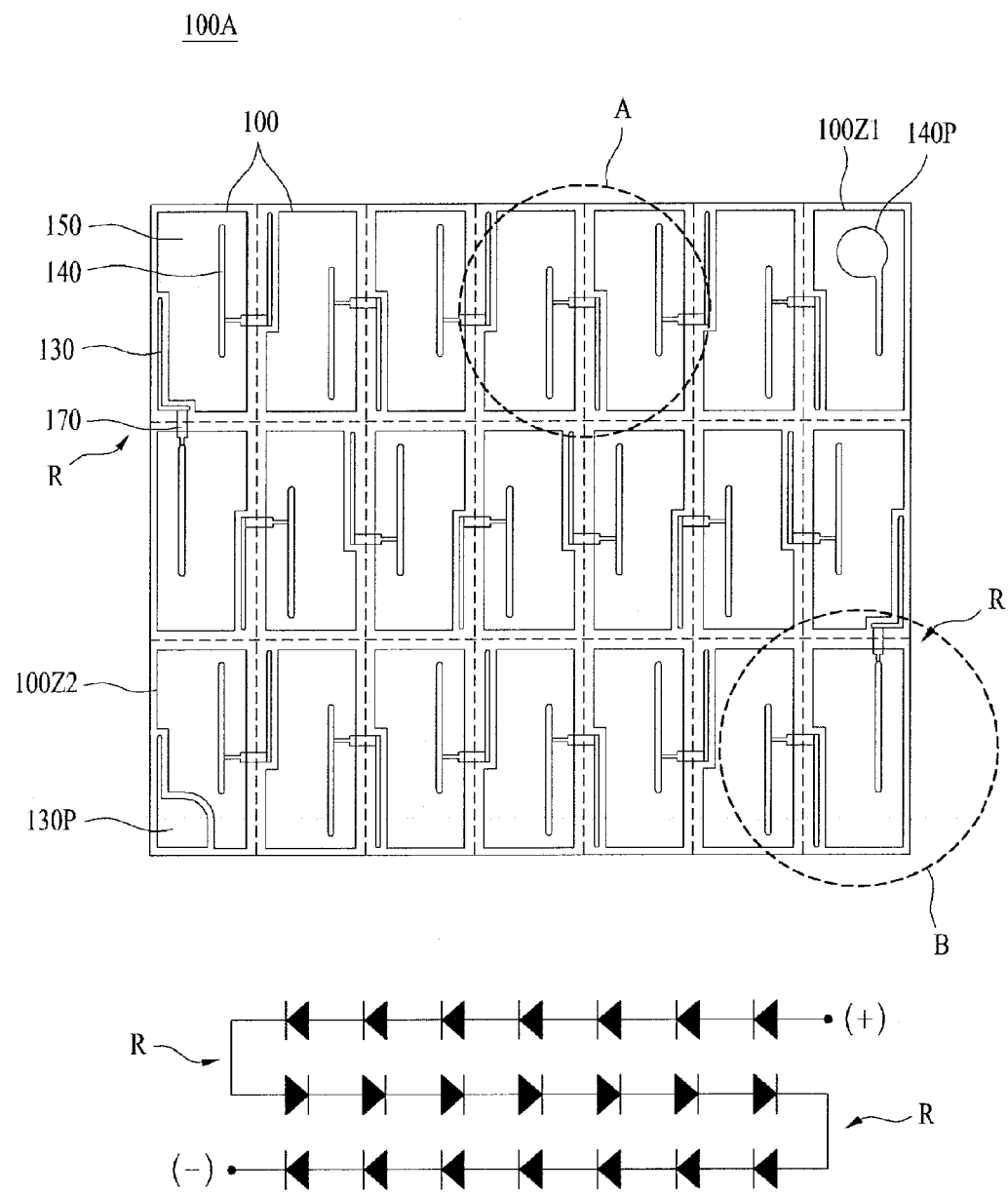
FIG. 1 is a plan view and a circuit diagram of a light emitting device in accordance with one embodiment.

Hereinafter, embodiments will be described with reference to the annexed drawings.

It will be understood that when an element is referred to as being 'on' or 'under' another element, it can be directly on/under the element, and one or more intervening elements may also be present. Expression of 'on' and 'under', may include the meaning of the downward direction as well as the upward direction based on one element.

In the drawings, the thicknesses or sizes of respective layers are exaggerated, omitted, or schematically illustrated for convenience and clarity of description. Further, the sizes of the respective elements do not denote the actual sizes thereof.

Figure 2:
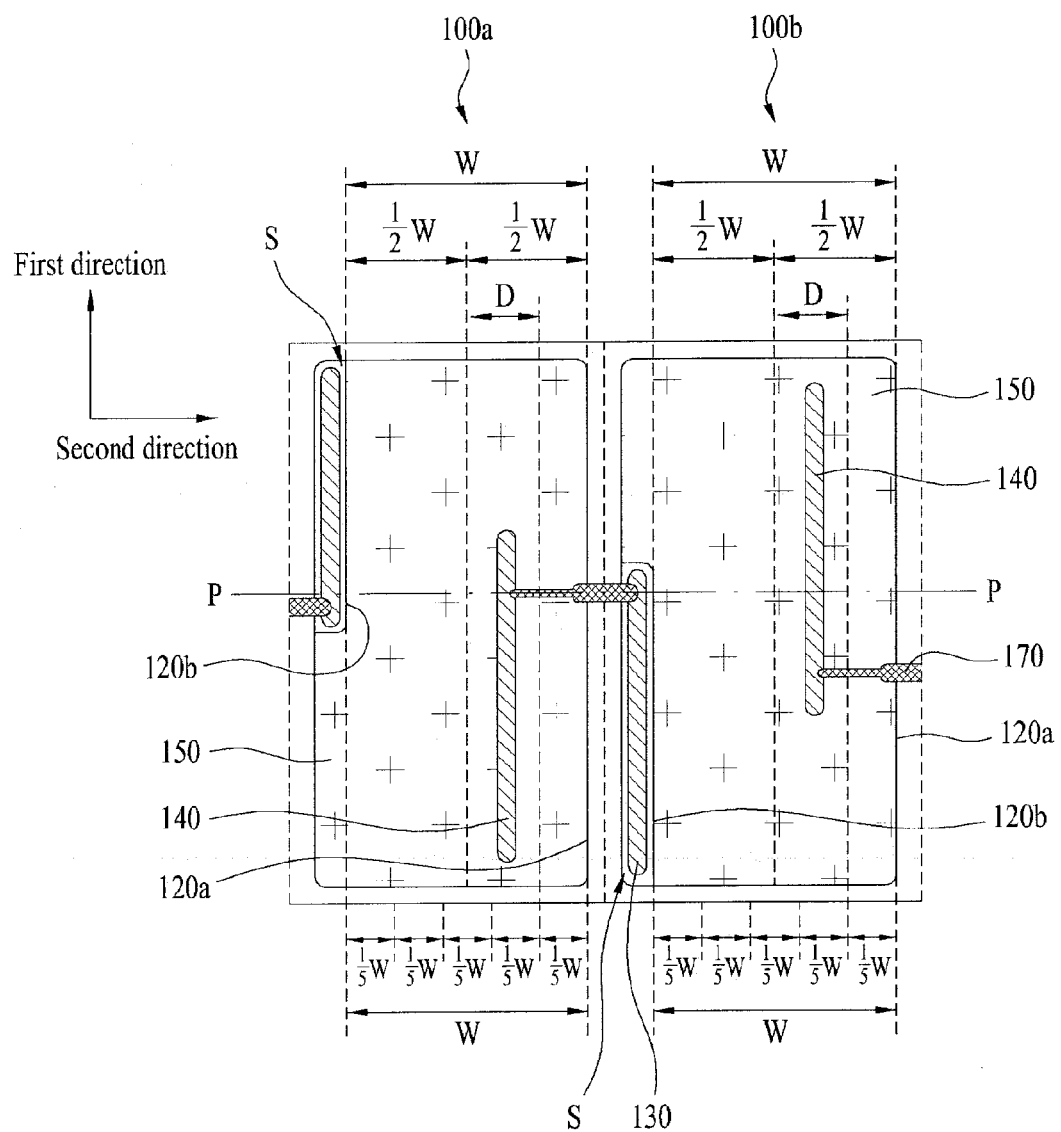
FIG. 2 is an enlarged view of the portion A of FIG. 1.
Figure 3:
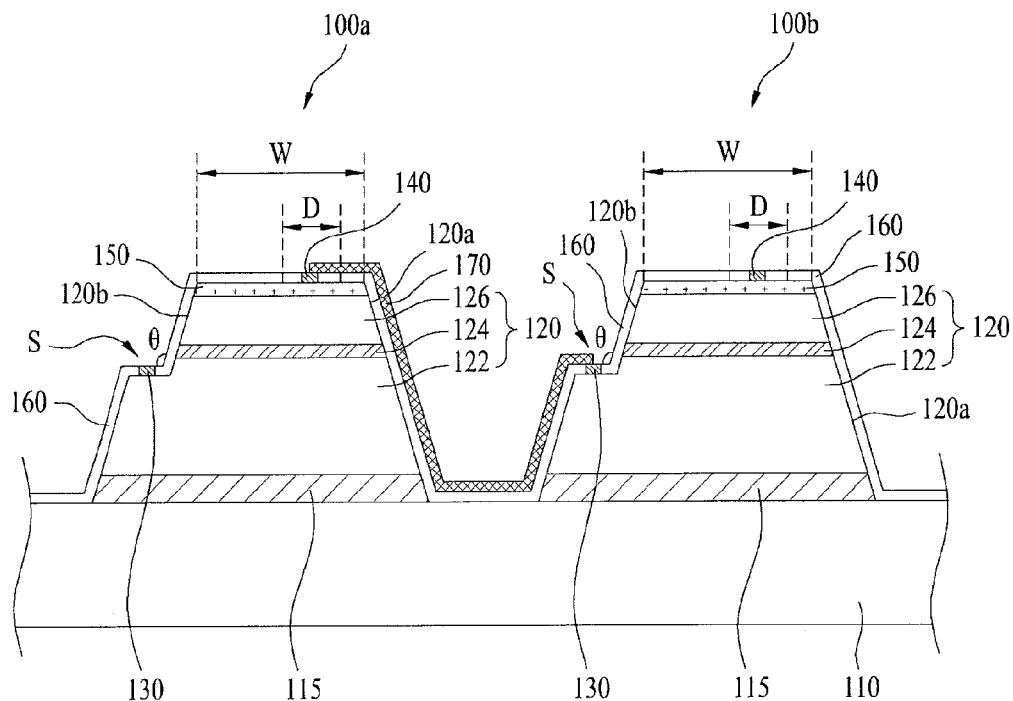
FIG. 3 is a cross-sectional view taken along the line P-P of FIG. 2.

FIG. 1A is a plan view of a light emitting device in accordance with one embodiment, FIG. 1B is a circuit diagram of the light emitting device, FIG. 2 is an enlarged view of the portion A of FIG. 1, and FIG. 3 is a cross-sectional view taken along the line P-P of FIG. 2.

With reference to FIGS. 1A to 3, a light emitting device 100A in accordance with this embodiment includes a substrate 110, a plurality of light emitting cells 100 separated from each other and provided on the substrate 110, and a plurality of conductive interconnection layers 170 electrically connecting two neighboring light emitting cells 100.

The substrate 110 may be formed of a material proper for semiconductor material growth, i.e., a material having high thermal conductivity. For example, the substrate 10 may be formed of at least one of sapphire ($Al_2O_3$), SiC, GaAs, GaN, ZnO, Si, GaP, InP, Ge, and $Ga_2O_3$. Impurities may be removed from the surface of the substrate 110 by performing wet cleaning upon the substrate 110.

The plural light emitting cells 100 separated from each other are provided on the substrate 110.

The light emitting cells 100 may include light emitting diodes (LEDs) using a plurality of compound semiconductor layers, for example, group III-V compound semiconductor layers, and the LEDs may be blue, green, or red LEDs emitting blue, green, or red light, white LEDs, or UV LEDs. Light may be emitted from the LEDs using various semiconductors, and the disclosure is not limited thereto.

With reference to FIG. 3, each of the plurality of light emitting cells 100 includes a light emitting structure 120 including a first conductivity-type semiconductor layer 122, an active layer 124 and a second conductivity-type semiconductor layer 126, a first electrode 130 disposed on the first conductivity-type semiconductor layer 122, and a second electrode 140 disposed on the second conductivity-type semiconductor layer 126.

For example, the light emitting structure 120 may be formed using a method, such as metal organic chemical vapor deposition (MOCVD), chemical vapor deposition (CVD), plasma-enhanced chemical vapor deposition (PECVD), molecular beam epitaxy (MBE), or hydride vapor phase epitaxy (HVPE), and the disclosure is not limited thereto.

The first conductivity-type semiconductor layer 122 may be formed of a semiconductor compound, for example, a group III-V or group II-VI compound semiconductor. Further, the first conductivity-type semiconductor layer 122 may be doped with a first conductivity-type dopant. If the first conductivity-type semiconductor layer 122 is an n-type semiconductor layer, the first conductivity-type dopant may be an n-type dopant including Si, Ge, Sn, Se, or Te, but is not limited thereto. If the first conductivity-type semiconductor layer 122 is a p-type semiconductor layer, the first conductivity-type dopant may be a p-type dopant including Mg, Zn, Ca, Sr, or Ba, but is not limited thereto.

The first conductivity-type semiconductor layer 122 may include a semiconductor material having a compositional formula of $Al_xIn_yGa(1-x-y)N$ ($0 \leq x \leq 1$, $0 \leq y \leq 1$, $0 \leq x+y \leq 1$). The first conductivity-type semiconductor layer 122 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The second conductivity-type semiconductor layer 126 may be formed of a semiconductor compound, for example, a group III-V or group II-VI compound semiconductor. Further, the second conductivity-type semiconductor layer 126 may be doped with a second conductivity-type dopant. The second conductivity-type semiconductor layer 126 may include a semiconductor material having a compositional formula of $In_xAl_yGa(1-x-y)N$ ($0 \leq x \leq 1$, $0 \leq y \leq 1$, $0 \leq x+y \leq 1$). The second conductivity-type semiconductor layer 126 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP. If the second conductivity-type semiconductor layer 126 is a p-type semiconductor layer, the second conductivity-type dopant may be a p-type dopant including Mg, Zn, Ca, Sr, or Ba, but is not limited thereto. If the second conductivity-type semiconductor layer 126 is an n-type semiconductor layer, the second conductivity-type dopant may be an n-type dopant including Si, Ge, Sn, Se, or Te, but is not limited thereto.

Hereinafter, the case in which the first conductivity-type semiconductor layer 122 is an n-type semiconductor layer and the second conductive semiconductor layer 126 is a p-type semiconductor layer will be exemplarily described.

A semiconductor layer having polarity opposite to the second conductivity-type semiconductor layer 126, for example, an n-type semiconductor layer (not shown) if the second conductivity-type semiconductor layer 126 is a p-type semiconductor layer, may be formed on the second conductivity-type semiconductor layer 126. Thereby, the light emitting structure may be formed in one structure of an n-p junction structure, a p-n junction structure, an n-p-n junction structure, and a p-n-p junction structure.

The active layer 124 may be disposed between the first conductivity-type semiconductor layer 122 and the second conductivity-type semiconductor layer 126.

The active layer 124 emits light having energy determined by the intrinsic energy band of an active layer (emission layer) material due to contact between electrons and holes. If the first conductivity-type semiconductor layer 122 is an n-type semiconductor layer and the second conductivity-type semiconductor layer 126 is a p-type semiconductor layer, electrons may be injected into the active layer 124 from the first conductivity-type semiconductor layer 122 and holes may be injected into the active layer 124 from the second conductivity-type semiconductor layer 126.

The active layer 124 may be formed in at least one structure of a single quantum well structure, a multi-quantum well structure, a quantum wire structure, and a quantum dot structure. For example, the active layer 124 may be formed in a multi-quantum well structure through injection of TMGa, NH3, N2, or TMIn gas, but is not limited thereto.

If the active layer 124 is formed in a multi-quantum well structure, well/barrier layers of the active layer 124 may be formed in at least one paired structure of InGaN/GaN, InGaN/InGaN, GaN/AlGaN, InAlGaN/GaN, GaAs(In-GaAs)/AlGaAs, and GaP(InGaP)/AlGaP, but are not limited thereto. The well layer may be formed of a material having a bandgap less than the bandgap of the barrier layer.

A buffer layer 115 may be disposed between the light emitting structure 120 and the substrate 110. The buffer layer 115 serves to relieve lattice mismatch of materials and a difference of thermal expansion coefficients between the light emitting structure 120 and the substrate 110. The buffer layer 115 may be formed of a group III-V compound semiconductor, for example, at least one of GaN, InN, AlN, InGaN, InAlGaN, and AlInN.

An undoped semiconductor layer (not shown) may be disposed between the substrate 110 and the first conductivity-type semiconductor layer 122. The undoped semiconductor layer serves to enhance crystallinity of the first conductivity-type semiconductor layer 122, and may be the same as the first conductivity-type semiconductor layer 122 except that the undoped semiconductor layer is not doped with an n-type dopant and thus has electrical conductivity lower than the first conductivity-type semiconductor layer 122.

The light emitting structure 120 includes an etching area S formed by partially etching the light emitting structure 120 to expose the first conductivity-type semiconductor layer 122. The etching area S means an area of the first conductivity-type semiconductor layer 122 which is exposed to the outside by partially etching the second conductivity-type semiconductor layer 126, the active layer 124, and the first conductivity-type semiconductor layer 122.

The second electrode 140 is disposed on the second conductivity-type semiconductor layer 126 and is electrically connected to the second conductivity-type semiconductor layer 126.

The first electrode 130 is disposed in the etching area S of the first conductivity-type semiconductor layer 122 exposed to the outside by etching and is electrically connected to the first conductivity-type semiconductor layer 122.

The first electrode 130 and the second electrode 140 may be formed in a single layered structure or a multi-layered structure including at least one of molybdenum (Mo), chrome (Cr), nickel (Ni), gold (Au), aluminum (Al), titanium (Ti), platinum (Pt), vanadium (V), tungsten (W), lead (Pd), copper (Cu), rhodium (Rh), and iridium (Ir).

Before formation of the second electrode 140, a conductive layer 150 may be disposed on the second conductivity-type semiconductor layer 126.

According to embodiments, a part of the conductive layer 150 may be opened to expose the second conductivity-type semiconductor layer 126 and thus, the second conductivity-type semiconductor layer 126 and the second electrode 140 may contact each other.

Otherwise, as exemplarily shown in FIG. 3, the second conductivity-type semiconductor layer 126 and the second electrode 140 may be electrically connected to each other under the condition that the conductive layer 150 is disposed therebetween.

The conductive layer 150 serves to enhance electrical characteristics of the second conductivity-type semiconductor layer 126 and electrical contact between the second conductivity-type semiconductor layer 126 and the second electrode 140, and may be formed in a layer or a plurality of patterns. The conductive layer 150 may be a transparent electrode layer having transmittance.

The conductive layer 150 may selectively use a light-transmitting conductive layer and a metal, and, for example, include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—GaZnO (AGZO), In—GaZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but is not limited thereto.

The conductive interconnection layer 170 is disposed between two neighboring light emitting cells 100. The conductive interconnection layer 170 electrically connects the two neighboring light emitting cells 100. The conductive interconnection layer 170 connects the first electrode 130 of one of the two neighboring light emitting cells 100 and the second electrode 140 of the other of the two neighboring light emitting cells 100, as exemplarily shown in FIGS. 1A to 3, and thus, the plural light emitting cells 100 may be connected in series. FIG. 1B is a circuit diagram briefly illustrating the plural light emitting cells 100 connected in series. Otherwise, although not shown in the drawings, the conductive interconnection layer 170 may connect the electrodes having the same polarity of the two neighboring light emitting cells 100, i.e., the first electrodes 130 or the second electrodes 140, and thus, the plural light emitting cells 100 may be connected in parallel.

For example, with reference to FIG. 3, the conductive interconnection layer 170 electrically connects two neighboring light emitting cells 100a and 100b. Specifically, the conductive interconnection layer 170 extends from the second electrode 140 of one light emitting cell 100a of the two neighboring light emitting cells 100a and 100b to the first electrode 130 of the other light emitting cell 100b along the side surface of the light emitting cell 100a and the side surface of the light emitting cell 100b and may thus connect the two neighboring light emitting cells 100a and 100b in series.

With reference to FIG. 3, the two neighboring light emitting cells 100a and 100b are separated from each other. Further, an insulating layer 160 is disposed on the side and upper surfaces of each of the light emitting structures 120. The insulating layer 160 may be disposed in the remainder of the side and upper surfaces of the light emitting structure 120 except for areas where the first electrode 130 and the second electrode 140 are disposed. The insulating layer 160 is disposed between the light emitting cells 100 and the conductive interconnection layer 170 in a region where the conductive interconnection layer 170 is present.

The insulating layer 160 serves to electrically isolate the neighboring light emitting cells 100 from each other or to electrically isolate the conductive interconnection layer 170 and the light emitting cells 100 from each other.

The insulating layer 160 may be formed of a non-conductive oxide or nitride, for example, silicon oxide (SiO2), silicon nitride, or aluminum oxide, but is not limited thereto.

With reference to FIGS. 1A to 3, the light emitting structure 120 includes a first side surface 120a adjacent to the second electrode 140 and parallel with the second electrode 140, and a second side surface 120b opposite to the first side surface 120a and contacting the etching area S. Being parallel with the second electrode 140 means being parallel with the longitudinal direction of the second electrode 140. The longitudinal direction of the second electrode 140 means a direction in which the longest side of the second electrode 140 is arranged.

The second side surface 120b contacts the etching area S in which the first electrode 130 is disposed, and is disposed at a designated angle θ from the etching area S. The angle θ between the etching area S and the second side surface 120b may be 90 degrees or more. The second side surface 120b corresponds to one side surface of the light emitting structure 120 exposed to the outside by etching, when the light emitting structure 120 is partially etched to form the etching area S.

As seen from the top, the second electrodes 140 of the plural light emitting cells 100 are disposed in a first direction parallel with the first side surface 120a.

If a width between the first side surface 120a and the second side surface 120b is defined as W, as seen from the top, the second electrode 140 is disposed in an area D between a position separated from the first side surface 120a by $$\frac{1}{5}W$$

and a position separated from the first side surface 120a by $$\frac{1}{2}W.$$

In order to enhance luminous intensity of the light emitting device 100A and to lower operating voltage of the light emitting device 100A, uniform spreading of current injected from the first electrode 130 and the second electrode 140 throughout the overall surface of the light emitting structure 120 is important. If the second electrode 140 is disposed in an area within the position separated from the first side surface 120a by $$\frac{1}{5}W,$$

the separation distance between the first electrode 130 and the second electrode 140 is increased and thus, current spreading is not effectively carried out, and if the second electrode 140 is disposed in an area exceeding the position separated from the first side surface 120a by $$\frac{1}{2}W,$$

the distance between the second electrode 140 and the first side surface 120a is increased and thus, current spreading is not effectively carried out.

Figure 4:
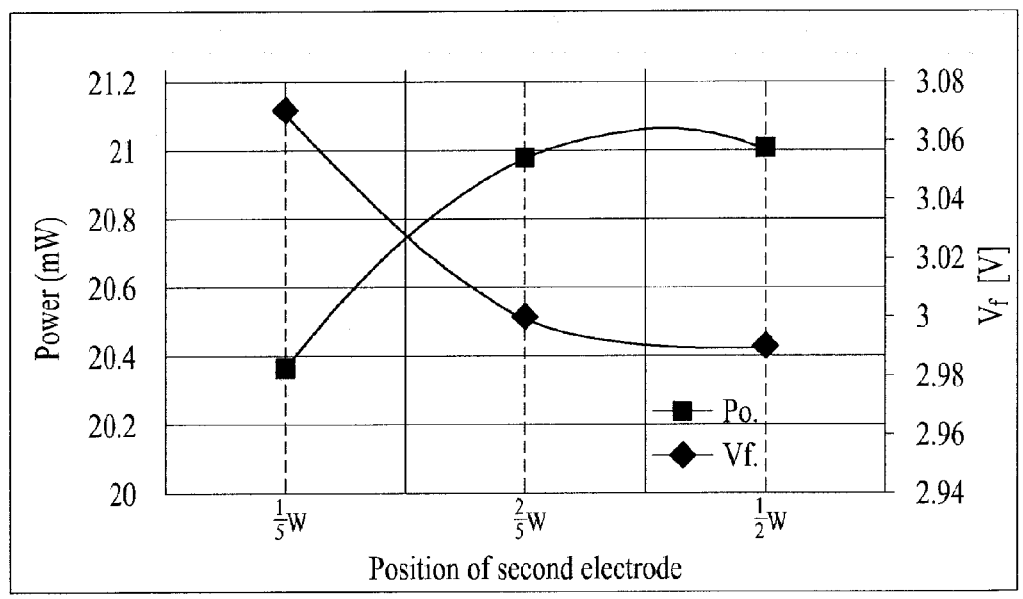
FIG. 4 is a graph illustrating output power (Po.) and operating voltage (Vf) according to positions of a second electrode when the second electrode is disposed in accordance with the embodiment.

FIG. 4 is a graph illustrating output power (Po.) and operating voltage (Vf) according to positions of the second electrode when the second electrode is disposed in accordance with the embodiment.

With reference to FIG. 4, it may be confirmed that, as the second electrode 140 moves from a position separated from the first side surface 120a by a distance of $$\frac{1}{5}W$$

to a position separated from the first side surface 120a by a distance of $$\frac{1}{2}W,$$

output power (Po.) is increased and operating voltage (Vf) is decreased. Particularly, as the second electrode 140 moves from the position separated from the first side surface 120a by a distance of $$\frac{1}{5}W$$

to a position separated from the first side surface 120a by a distance of $$\frac{2}{5}W,$$

enhancement effect of the output power (Po.) and the operating voltage (Vf) is great. Further, as the second electrode 140 moves from the position separated from the first side surface 120a by a distance of $$\frac{2}{5}W$$

to the position separated from the first side surface 120a by a distance of $$\frac{1}{2}W,$$

enhancement effect of the output power (Po.) and the operating voltage (Vf) is converged.

Table 1 states detailed values at positions of the second electrode 140 separated from the first side surface 120a by distances of $$\frac{1}{5}W, \frac{2}{5}W, \text{ and } \frac{1}{2}W.$$

TABLE 1

| Position of second electrode | Po.[mV] | Vf[V] |
| --- | --- | --- |
| $\frac{1}{5}W$ | 20.36 | 3.07 |
| $\frac{2}{5}W$ | 20.97 | 3 |
| $\frac{1}{2}W$ | 21 | 2.99 |

That is, when the distance between the first electrode 130 and the second electrode 140 is optimized, current spreading is effectively carried out and thus, output power is increased and operating voltage (Vf) is decreased.

Referring to FIG. 2 again, at least one of the plural conductive interconnection layers 170 may be disposed in a second direction differing from the first direction. According to embodiments, the second direction may be vertical to the first direction.

As both ends of the conductive interconnection layer 170 respectively overlap with the second electrode 140 of one light emitting cell 100a of the neighboring light emitting cells 100a and 100b and the first electrode 130 of the other light emitting cell 100b, the conductive interconnection layer 170 electrically connects the neighboring light emitting cells 100a and 100b.

In order to minimize absorption of light generated in the active layer 124, the width of a portion of the conductive interconnection layer 170 disposed on the light emitting structure 120 may be less than the width of a portion of the conductive interconnection layer 170 disposed between the neighboring light emitting cells 100a and 100b.

Figure 5:
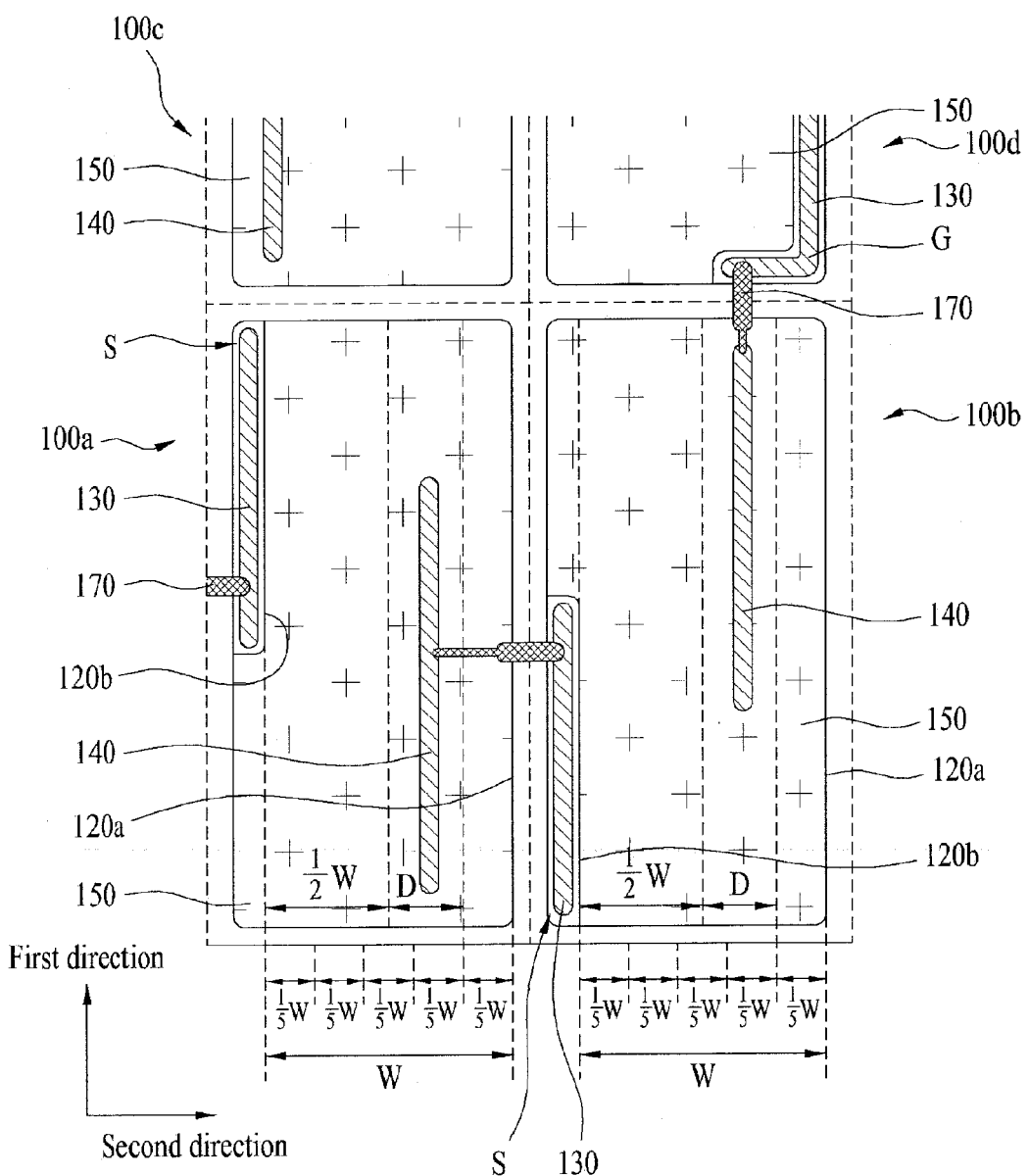
FIG. 5 is an enlarged view of the portion B of FIG. 1.

FIG. 5 is an enlarged view of the portion B of FIG. 1.

With reference to FIG. 5, at least one of the plural conductive interconnection layers 170 may be disposed in the first direction. Here, the first electrode 130 of one light emitting cell 100d of two neighboring light emitting cells 100b and 100d may be disposed at the edge area of the light emitting cell 100d in order to minimize loss of the active layer 124, and the second electrode 140 of the other light emitting cell 100b may be disposed an area D between a position separated from the first side surface 120a by a distance of $$\frac{1}{5}W$$

and a position separated from the first side surface 120a by a distance of $$\frac{1}{2}W,$$

so that the first electrode 130 and the second electrode 140 may not be disposed on the same line, i.e., may be disposed on different lines. Therefore, the first electrode 130 of the light emitting cell 100d contacting the conductive interconnection layer 170 disposed in the first direction may include a bent part G.

With reference to FIG. 1, according to embodiments, a region at which the conductive interconnection layer 170 disposed in the first direction is disposed may be a region of the light emitting device 100A in which the arrangement direction of the light emitting cells 100 is changed.

With reference to FIG. 1, a light emitting cell 100Z1 present at one end of arrangement of the plural light emitting cells 100 may include an electrode pad 140p in the second electrode 140 so as to secure a dimension for wire-bonding. In the same manner, a light emitting cell 100Z2 present at another end of arrangement of the plural light emitting cells 100 may include an electrode pad 130p in the first electrode 130 so as to secure a dimension for wire-bonding.

Figure 6:
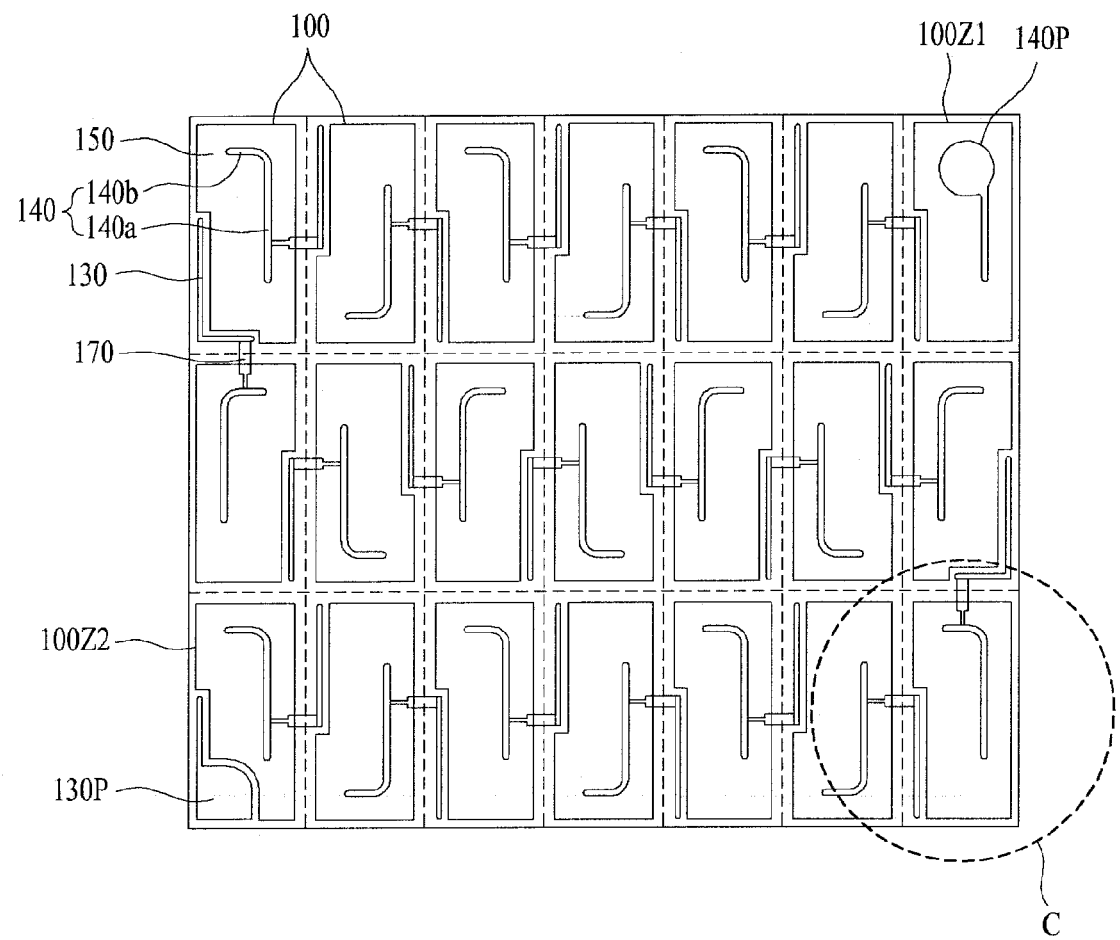
FIG. 6 is a plan view and a circuit diagram of a light emitting device in accordance with another embodiment.
Figure 6:
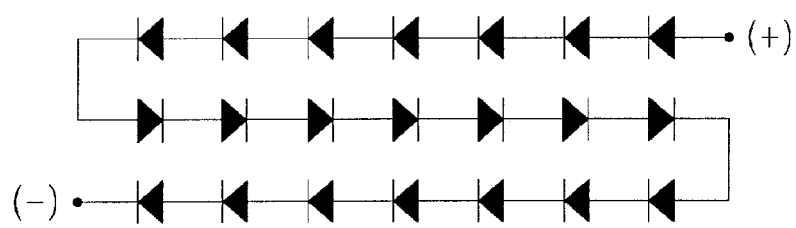
Figure 7:
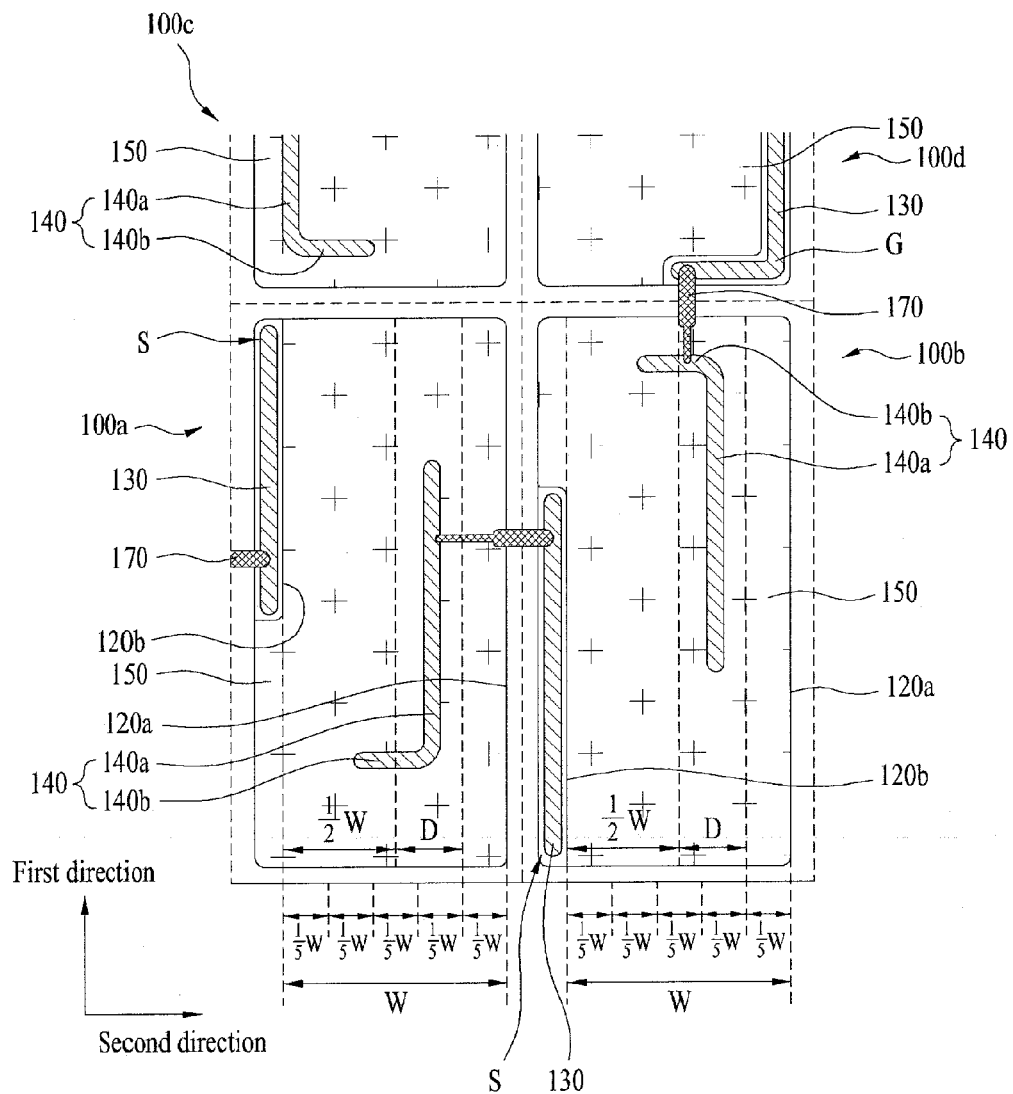
FIG. 7 is an enlarged view of the portion C of FIG. 6.

FIG. 6A is a plan view of a light emitting device in accordance with another embodiment, FIG. 6B is a circuit diagram of the light emitting device, and FIG. 7 is an enlarged view of the portion C of FIG. 6. Illustration of a cross-sectional view of the light emitting device in accordance with this embodiment is omitted and FIG. 3 will be referred to. A detailed description of some parts in this embodiment which are substantially the same as those in the earlier embodiment will be omitted because it is considered to be unnecessary.

With reference to FIGS. 6A to 7, a light emitting device 100B in accordance with this embodiment includes a substrate 110, a plurality of light emitting cells 100 separated from each other and provided on the substrate 110, and a plurality of conductive interconnection layers 170 electrically connecting two neighboring light emitting cells 100.

Each of the plurality of light emitting cells 100 includes a light emitting structure 120 including a first conductivity-type semiconductor layer 122, an active layer 124 and a second conductivity-type semiconductor layer 126, a first electrode 130 disposed on the first conductivity-type semiconductor layer 122, and a second electrode 140 disposed on the second conductivity-type semiconductor layer 126.

The light emitting structure 120 includes an etching area S formed by partially etching the light emitting structure 120 so as to expose the first conductivity-type semiconductor layer 122. The etching area S means an area of the first conductivity-type semiconductor layer 122 exposed to the outside by partially etching the second conductivity-type semiconductor layer 126, the active layer 124, and the first conductivity-type semiconductor layer 122.

The conductive interconnection layer 170 is disposed between two neighboring light emitting cells 100. The conductive interconnection layer 170 electrically connects the two neighboring light emitting cells 100.

The second electrode 140 includes a first part 140a and a second part 140b connected to the first part 140a and disposed in a different direction from the first part 140a.

The light emitting structure 120 includes a first side surface 120a adjacent to the first part 140a of the second electrode 140 and parallel with the first part 140a, and a second side surface 120b opposite to the first side surface 120a and contacting the etching area S. Being parallel with the first part 140a of the second electrode 140 means being parallel with the longitudinal direction of the first part 140a. The longitudinal direction of the first part 140a means a direction in which the longest side of the first part 140a is arranged.

The first part 140a of the second electrode 140 is disposed in a first direction parallel with the first side surface 120a, and the second part 140b of the second electrode 140 is disposed in a second direction differing from the first direction. According to embodiments, the second direction may be vertical to the first direction.

If a width between the first side surface 120a and the second side surface 120b is defined as W, as seen from the top, the first part 140a of the second electrode 140 is disposed within an area D between a position separated from the first side surface 120a by a distance of $$\frac{1}{5}W$$

and a position separated from the first side surface 120a by a distance of $$\frac{1}{2}W.$$

Here, the second part 140b of the second electrode 140 may be disposed within the area D, or at least a portion of the second part 140b may deviate from the area D.

In order to enhance luminous intensity of the light emitting device 100B and to lower operating voltage of the light emitting device 100B, uniform spreading of current injected from the first electrode 130 and the second electrode 140 throughout the overall surface of the light emitting structure 120 is important. If the first part 140a of the second electrode 140 is disposed in an area within the position separated from the first side surface 120a by a distance of $$\frac{1}{5}W,$$

the separation distance between the first electrode 130 and the second electrode 140 is increased and thus, current spreading is not effectively carried out, and if the first part 140a of the second electrode 140 is disposed in an area exceeding the position separated from the first side surface 120a by a distance of $$\frac{1}{2}W,$$

the distance between the second electrode 140 and the first side surface 120a is increased and thus, current spreading is not effectively carried out.

The second electrode 140 including the first part 140a and the second part 140b may more effectively achieve current spreading than the second electrode 140 including only the first part 140a.

The first part 140a of the second electrode 140 may be elongated, as compared to the second part 140b. That is, the length of the first part 140a corresponding to the long direction of the light emitting structure 120 may be greater than the length of the second part 140b corresponding to the short direction of the light emitting structure 120.

At least one of the plural conductive interconnection layers 170 is disposed in a second direction differing from the first direction.

As both ends of the conductive interconnection layer 170 respectively overlap with the first electrode 130 of one light emitting cell 100a of the neighboring light emitting cells 100a and 100b and the second electrode 140 of the other light emitting cell 100b, the conductive interconnection layer 170 electrically connects the neighboring light emitting cells 100a and 100b. Otherwise, as both ends of the conductive interconnection layer 170 respectively overlap with the first electrode 130 of one light emitting cell 100b of the neighboring light emitting cells 100a and 100b and the second electrode 140 of the other light emitting cell 100a, the conductive interconnection layer 170 electrically connects the neighboring light emitting cells 100a and 100b.

Further, at least one of the plural conductive interconnection layers 170 may be disposed in the first direction. Here, the first electrode 130 of one light emitting cell 100d of two neighboring light emitting cells 100b and 100d may be disposed at the edge area of the light emitting cell 100d in order to minimize loss of the active layer 124, and the first part 140a of the second electrode 140 of the other light emitting cell 100b may be disposed an area D between a position separated from the first side surface 120a by a distance of $$\frac{1}{5}w$$

and a position separated from the first side surface 120a by a distance of $$\frac{1}{2}w,$$

so that the first electrode 130 of the light emitting cell 100d and the first part 140a of the second electrode 140 of the light emitting cell 100b may not be disposed on the same line. Therefore, the first electrode 130 of the light emitting cell 100d contacting the conductive interconnection layer 170 disposed in the first direction may include a bent part G.

If the conductive interconnection layer 170 is disposed in the first direction, one end of the conductive interconnection layer 170 may overlap with the second part 140b of the second electrode 140.

According to embodiments, a region at which the conductive interconnection layer 170 disposed in the first direction is disposed may be a region of the light emitting device 100B in which the arrangement direction of the light emitting cells 100 is changed.

Figure 8:
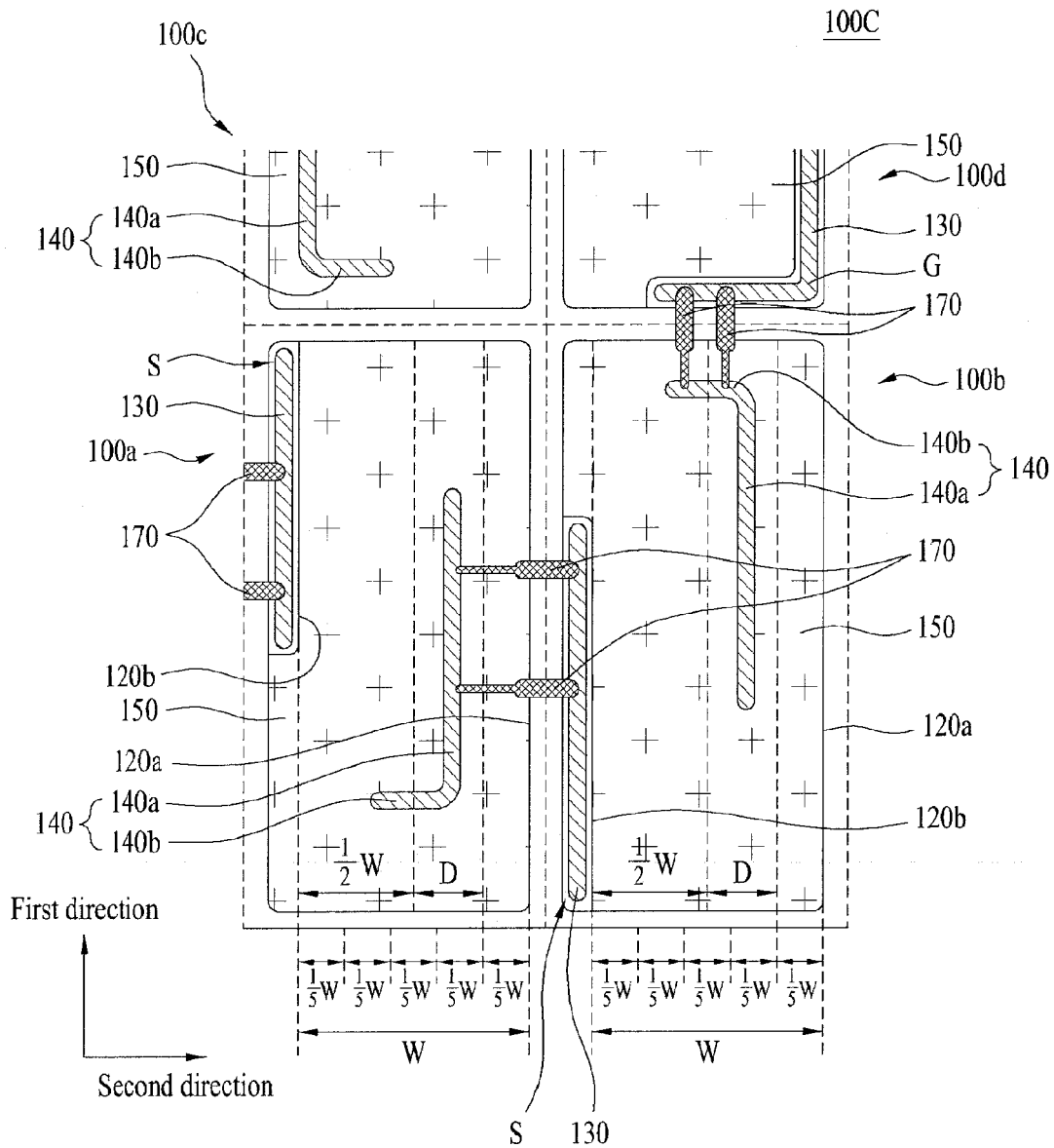
FIG. 8 is a top view of a portion of a light emitting device in accordance with another embodiment.

FIG. 8 is a top view of a portion of a light emitting device in accordance with another embodiment. A detailed description of some parts in this embodiment which are substantially the same as those in the earlier embodiments will be omitted because it is considered to be unnecessary.

A plurality of conductive interconnection layers 170 may be provided between two neighboring light emitting cells. For example, with reference to FIG. 8, two conductive interconnection layers 170 are provided between two neighboring light emitting cells 100b and 100d, and two conductive interconnection layers 170 are provided between two neighboring light emitting cells 100a and 100b.

The number of conductive interconnection layers 170 provided between two neighboring light emitting cells may vary according to embodiments, and the plural conductive interconnection layers 170 may be separated from one another.

Figure 9:
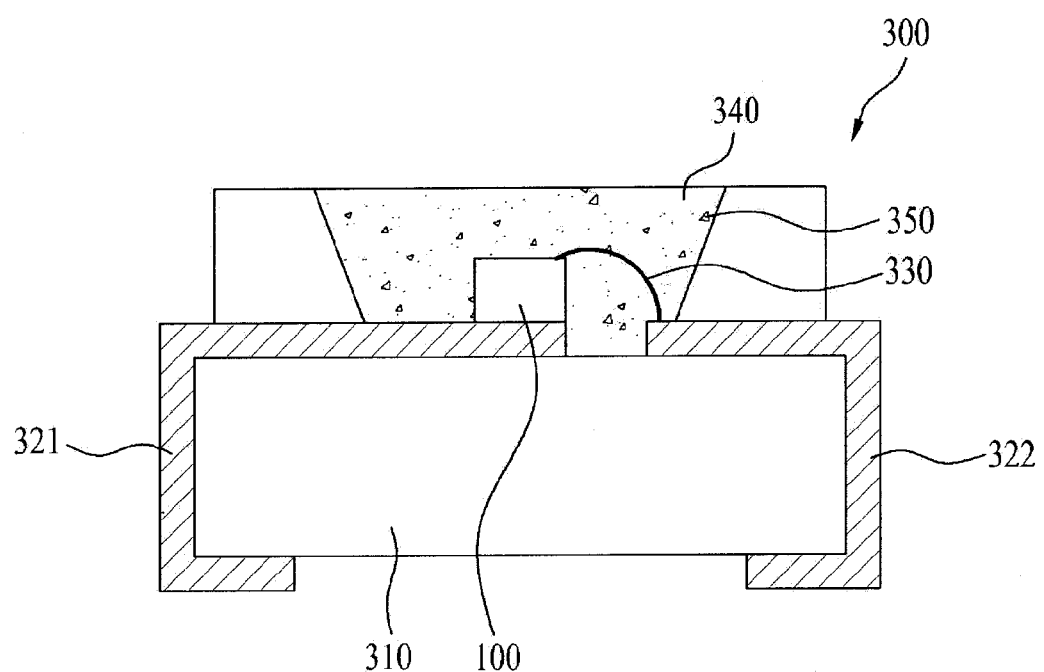
FIG. 9 is a view illustrating a light emitting device package having a light emitting device in accordance with one embodiment.

FIG. 9 is a view illustrating a light emitting device package having a light emitting device in accordance with one embodiment.

A light emitting device package 300 in accordance with this embodiment includes a body 310, a first lead frame 321 and a second lead frame 322 disposed on the body 310, a light emitting device 100 in accordance with one of the above-described embodiments, disposed on the body 310 and electrically connected to the first lead frame 321 and the second lead frame 322, and a molding part 340 formed in a cavity. The cavity may be formed in the body 310. The light emitting device 100 is one chip including a plurality of light emitting cells connected in series or in parallel, as described above.

The body 310 may be formed of silicon, a synthetic resin, or metal. If the body 310 is formed of a conductive material, such as metal, the surface of the body 310 may be coated with an insulating layer (not shown) so as to prevent an electrical short circuit between the first and second lead frames 321 and 322.

The first lead frame 321 and the second lead frame 322 are electrically isolated and supply current to the light emitting device 100. Further, the first lead frame 321 and the second lead frame 322 may reflect light emitted from the light emitting device 100 to increase luminance efficiency, and dissipate heat generated by the light emitting device 100 to the outside.

The light emitting device 100 may be disposed on the body 310, or be disposed on the first lead frame 321 or the second lead frame 322. In this embodiment, the first lead frame 321 and the light emitting device 100 are directly electrically connected, and the second lead frame 322 and the light emitting device 100 are electrically connected through a wire 330. The light emitting device 100 may be connected to the lead frames 321 and 322 by flip chip-bonding or die-bonding in addition to wire-bonding.

The molding part 340 may surround and protect the light emitting device 100. Further, the molding part 340 may include a phosphor 350, thus changing the wavelength of light emitted from the light emitting device 100.

The phosphor 350 may be a garnet phosphor, a silicate phosphor, a nitride phosphor, or oxynitride phosphor.

For example, the garnet phosphor may be YAG (Y3Al5O12:Ce3+) or TAG(Tb3Al5O12:Ce3+), the silicate phosphor may be (Sr, Ba, Mg, Ca)2SiO4:Eu2+, the nitride phosphor may be CaAlSiN3:Eu2+ including SiN, and the oxynitride phosphor may be Si6−xAlxOyN8−x:Eu2+ (0<x<6) including SiON.

Light of a first wavelength emitted from the light emitting device 100 may be excited by the phosphor 350 and be converted into light of a second wavelength, and as the light of the second wavelength passes through a lens (not shown), a light path may be changed.

Plural light emitting device packages in accordance with this embodiment may be arranged on a substrate, and optical members, such as a light guide panel, a prism sheet, a diffusion sheet, etc., may be disposed on a light path of the light emitting device packages. The light emitting device packages, the substrate, and the optical members may function as a light unit. Another embodiment may implement a display device, an indicator device, or a lighting system including the semiconductor light emitting devices or the light emitting device packages in accordance with the above-described embodiments, and the lighting system may include, for example, a lamp or a streetlamp.

Hereinafter, as examples of a lighting system including the above-described light emitting devices or light emitting device packages, a backlight unit and a lighting apparatus will be described.

Figure 10:
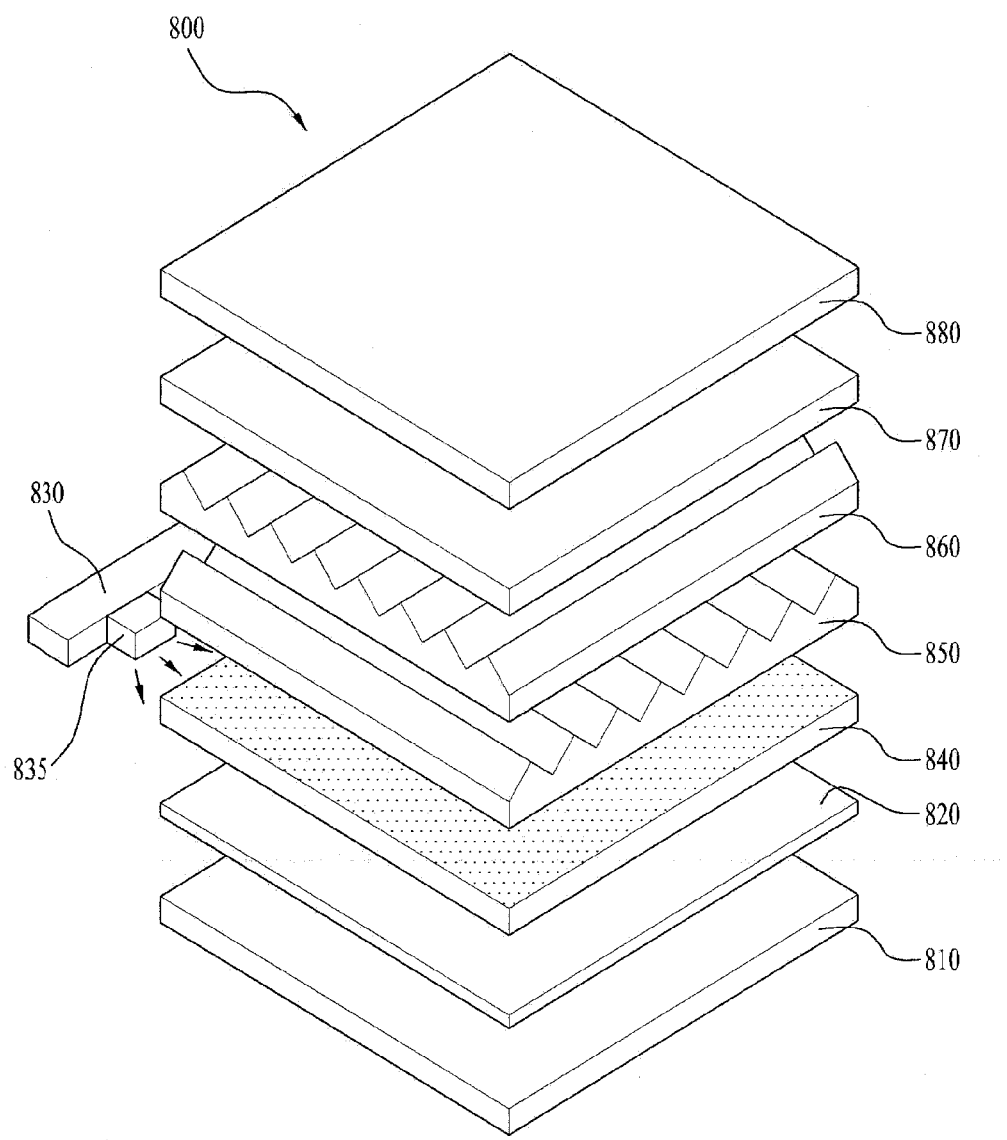
FIG. 10 is a view illustrating a display device having light emitting device packages in accordance with one embodiment.

FIG. 10 is a view illustrating a display device having light emitting device packages in accordance with one embodiment.

With reference to FIG. 10, a display device 800 in accordance with this embodiment includes a light emitting module, a reflective plate 820 on a bottom cover 810, a light guide panel 840 disposed in front of the reflective plate 820 and guiding light emitted from the light emitting module in the forward direction of the display device 800, a first prism sheet 850 and a second prism sheet 860 disposed in front of the light guide panel 840, a panel 870 disposed in front of the second prism sheet 860, and a color filter 880 disposed in front of the panel 870.

The light emitting module includes light emitting device packages 835 disposed on a circuit board 830. Here, a PCB may be used as the circuit board 830, and each light emitting device package 835 may be the light emitting device package described above with reference to FIG. 9.

The bottom cover 819 may accommodate components within the display device 800. The reflective plate 820 may be separately provided, as shown in FIG. 10, or be provided by coating the rear surface of the light guide panel 840 or the front surface of the bottom cover 810 with a material having high reflectivity.

Here, the reflective plate 820 may be formed of a material which has high reflectivity and is usable in an ultra-thin type, and be formed of polyethyleneterephtalate (PET).

The light guide panel 840 scatters light emitted from the light emitting module so that the light may be uniformly distributed throughout the entire area of a screen of a liquid crystal display device. Therefore, the light guide panel 840 may be formed of a material having a high refractive index and high transmissivity, for example, polymethylmethacrylate (PMMA), polycarbonate (PC), or polyethylene (PE). Further, an air guide type in which the light guide panel 840 is omitted and light is transmitted in a space above the reflective sheet 820 may be employed.

The first prism sheet 850 is formed by applying a light-transmitting and elastic polymer to one surface of a support film. The polymer may have a prism layer in which plural 3D structures are repeated. Here, the plural structures may be provided in a stripe pattern in which projections and depressions are repeated, as shown in FIG. 10.

The direction of projections and depressions formed on one surface of a support film of the second prism sheet 860 may be vertical to the direction of the projections and the depressions formed on one surface of the support film of the first prism sheet 850. This serves to uniformly disperse light transmitted from the light emitting module and the reflective sheet 820 in all directions of the panel 870.

In this embodiment, the first prism sheet 850 and the second prism sheet 860 are used as the optical sheets. The optical sheets may include other combinations, for example, a micro-lens array, a combination of a diffusion sheet and a micro-lens array, or a combination of one prism sheet and a micro-lens array.

As the panel 870, a liquid crystal display panel may be provided. Further, in addition to the liquid crystal display panel, other kinds of display device requiring light sources may be provided.

The panel 870 is configured such that liquid crystals are provided between two glass bodies and polarizing plates are respectively mounted on the glass bodies so as to utilize polarization of light. Here, liquid crystals have intermediate properties between a liquid and a solid in which organic molecules having fluidity like a liquid, i.e., liquid crystals, are regularly arranged, and display an image using change of molecular arrangement by an external electric field.

The liquid crystal display panel used in the display device is an active matrix type, and uses transistors as switches to adjust voltage applied to respective pixels.

The color filter 880 is provided on the front surface of the panel 870, and transmits only red, green and blue light among light projected by the panel 870 per pixel, thus displaying an image.

Figure 11:
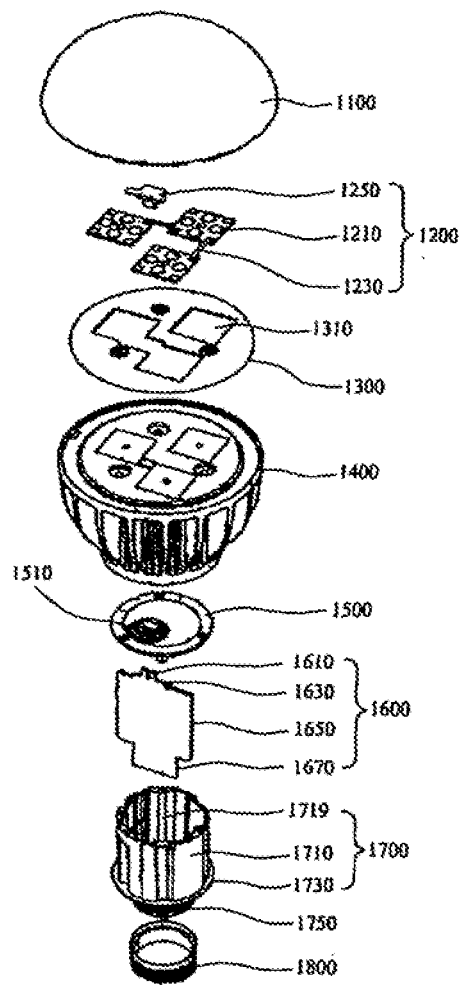
FIG. 11 is a view illustrating a lighting apparatus having light emitting devices or light emitting device packages in accordance with one embodiment.

FIG. 11 is a view illustrating a lighting apparatus having light emitting devices or light emitting device packages in accordance with one embodiment.

A lighting apparatus in accordance with this embodiment may include a cover 1100, a light source module 1200, a heat sink 1400, a power supply unit 1600, an inner case 1700, and a socket 1800. The lighting apparatus in accordance with this embodiment may further include at least one of a member 1300 and a holder 1500, and the light source module 1200 may include light emitting device packages in accordance with the above-described embodiment.

The cover 1100 may have a bulb or hemispheric shape which is hollow and is provided with one opened end. The cover 1100 may be optically combined with the light source module 1200. For example, the cover 1100 may diffuse, scatter, or excite light supplied from the light source module 1200. The cover 1100 may be a kind of optical member. The cover 1100 may be combined with the heat sink 1400. The cover 1100 may have a connection part to be combined with the heat sink 1400.

The inner surface of the cover 1100 may be coated with a milk-white paint. The milk-white paint may include a light diffuser diffusing light. Surface roughness of the inner surface of the cover 1100 may be greater than surface roughness of the outer surface of the cover 1100. This serves to sufficiently scatter and diffuse light emitted from the light source module 1200 and to discharge the light to the outside.

The cover 1100 may be formed of glass, plastic, polypropylene (PP), polyethylene (PE), polycarbonate (PC), etc. Here, polycarbonate (PC) has excellent light resistance, heat resistance, and strength. The cover 1100 may be transparent so that the light source module 1200 is visible from the outside, or be opaque. The cover 1100 may be formed by blow molding.

The light source module 1200 may be disposed on one surface of the heat sink 1400. Therefore, heat from the light source module 1200 is conducted to the heat sink 1400. The light source module 1200 may include light emitting device packages 1210, connection plates 1230, and a connector 1250.

The member 1300 may be disposed on the upper surface of the heat sink 1400, and include guide holes 1310 into which the plural light emitting device packages 1210 and the connector 1250 are inserted. The guide holes 1310 correspond to substrates of the light emitting device packages 1210 and the connector 1250.

A light reflecting material may be applied to or coated on the surface of the member 1300. For example, a white paint may be applied to or coated on the surface of the member 1300. The member 1300 reflects light, reflected by the inner surface of the cover 1100 and returning in the direction toward the light source module 1200, to the cover 1100. Therefore, the member 1300 may enhance luminance efficiency of the lighting apparatus in accordance with this embodiment.

The member 1300 may be formed of, for example, an insulating material. The connection plates 1230 of the light source module 1200 may include an electrically conductive material. Therefore, the heat sink 1400 and the connection plates 1230 may electrically contact each other. The member 1300 formed of an insulating material may prevent electrical short circuit between the connection plates 1230 and the heat sink 1400. The heat sink 1400 receives heat from the light source module 1200 and the power supply unit 1600, and dissipates the heat.

The holder 1500 closes an accommodation hole 1719 of an insulating part 1710 of the inner case 1700. Therefore, the power supply unit 1600 accommodated in the insulating part 1710 of the inner case 1700 is hermetically sealed. The holder 1600 has a guide protrusion 1510. The guide protrusion 1510 is provided with a hole through which protrusions 1610 of the power supply unit 1600 pass.

The power supply unit 1600 processes or converts an electrical signal provided from the outside, and then supplies the processed or converted electrical signal to the light source module 1200. The power supply unit 1600 is accommodated in the accommodation hole 1719 of the inner case 1700, and is hermetically sealed within the inner case 1700 by the holder 1500. The power supply unit 1600 may include the protrusions 1610, a guide part 1630, a base 1650, and an extension 1670.

The guide part 1630 protrudes from one side of the base 1650 to the outside. The guide part 1630 may be inserted into the holder 1500. Plural components may be disposed on one surface of the base 1650. For example, the plural components may include an AC/DC converter converting AC power supplied from an external power source into DC power, a drive chip controlling driving of the light source module 1200, and an electrostatic discharge (ESD) protection element to protect the light source module 1200, but are not limited thereto.

The extension 1670 protrudes from the other side of the base 1650 to the outside. The extension 1670 is inserted into a connection part 1750 of the inner case 1700 and receives an electrical signal provided from the outside. For example, the extension 1670 may have a width equal to or smaller than the width of the connection part 1750 of the inner case 1700. One end of each of a positive (+) electric wire and a negative (−) electric wire may be electrically connected to the extension 1670, and the other end of each of the positive (+) electric wire and the negative (−) electric wire may be electrically connected to the socket 1800.

The inner case 1700 may include a molding part together with the power supply unit 160 therein. The molding part is formed by hardening a molding liquid, and serves to fix the power supply unit 160 within the inner case 1700.

As is apparent from the above description, a light emitting device in accordance with one embodiment may enhance current spreading between a first electrode and a second electrode, thus enhancing luminous intensity and lowering operating voltage.

Embodiments provide a light emitting device in which current spreading is enhanced.

In one embodiment, a light emitting device includes a substrate, a plurality of light emitting cells separated from each other and disposed on the substrate, and a plurality of conductive interconnection layers electrically connecting two neighboring light emitting cells, wherein each of the plurality of light emitting cells includes a light emitting structure including a first conductivity-type semiconductor layer, an active layer and a second conductivity-type semiconductor layer, a first electrode disposed on the first conductivity-type semiconductor layer, a second electrode disposed on the second conductivity-type semiconductor layer, and an etching area, in which the first conductivity-type semiconductor layer is exposed, formed by partially etching the light emitting structure, wherein the light emitting structure further includes a first side surface adjacent to the second electrode and parallel with the second electrode and a second side surface opposite to the first side surface and contacting the etching area, and if a width between the first side surface and the second side surface is defined as W, as seen from the top, the second electrode is disposed in an area between a position separated from the first side surface of the light emitting structure by $$\frac{1}{5}W$$

and a position separated from the first side surface of the light emitting structure by $$\frac{1}{2}W.$$

The second electrode may be disposed in a first direction parallel with the first side surface, and at least one of the plurality of conductive interconnection layers may be disposed in the first direction.

The second electrode may be disposed in a first direction parallel with the first side surface, and at least one of the plurality of conductive interconnection layers may be disposed in a second direction differing from the first direction.

The second electrode may include a first part disposed in a first direction parallel with the first side surface and a second part disposed in a second direction differing from the first direction.

One end of at least one of the plurality of conductive interconnection layers may overlap with the second part.

One of the plurality of conductive interconnection layers may connect the first electrode of one of the two neighboring light emitting cells and the second electrode of the other of the two neighboring light emitting cells.

Plurality of the conductive interconnection layers may be provided between the two neighboring light emitting cells.

The light emitting device may further include an insulating layer disposed on the side surfaces of each of the plurality of light emitting cells, and the insulating layer electrically may isolate the two neighboring light emitting cells and/or the plurality of conductive interconnection layers and the plurality of light emitting cells.

At least a portion of the second part may deviate from the area between the position separated from the first side surface of the light emitting structure by $$\frac{1}{5}W$$

and the position separated from the first side surface of the light emitting structure by $$\frac{1}{2}W.$$

Plurality of the conductive interconnection layers may connect plurality of the light emitting cells in series or in parallel.

The second side surface may be disposed at a predetermined angle from the etching area.

The width of a portion of the conductive interconnection layer disposed on the light emitting cell may be less than the width of a portion of the conductive interconnection layer disposed between the two neighboring light emitting cells.

The first electrode of one light emitting cell may be disposed at the edge of the light emitting cell.

The second electrode of another light emitting cell adjacent to the light emitting cell may be disposed on a line differing from the line on which the first electrode of the light emitting cell is disposed.

The first electrode of the light emitting cell contacting the at least one conductive interconnection layer disposed in the first direction may include a bent part.

The arrangement direction of the neighboring light emitting cells in a region at which the plurality of conductive interconnection layers may be differ from the arrangement direction of the neighboring light emitting cells in other regions.

The length of the first part of the second electrode may be greater than the length of the second part of the second electrode.

Plurality of conductive interconnection layers may be disposed in a first direction and a second direction different to the first direction.

In another embodiment, a light emitting device includes a substrate, a plurality of light emitting cells separated from each other and disposed on the substrate, and a plurality of conductive interconnection layers electrically connecting two neighboring light emitting cells, wherein each of the plurality of light emitting cells includes a light emitting structure including a first conductivity-type semiconductor layer, an active layer and a second conductivity-type semiconductor layer, a first electrode disposed on the first conductivity-type semiconductor layer, a second electrode disposed on the second conductivity-type semiconductor layer, and an etching area, in which the first conductivity-type semiconductor layer is exposed, formed by partially etching the light emitting structure, wherein the light emitting structure further includes a first side surface adjacent to the second electrode and parallel with the second electrode and a second side surface opposite to the first side surface and contacting the etching area, and if a width between the first side surface and the second side surface is defined as W, as seen from the top, the second electrode includes a first part disposed in a first direction parallel with the first side surface and a second part disposed in a second direction differing from the first direction, and at least a portion of the second part deviates from an area between a position separated from the first side surface of the light emitting structure by $$\frac{1}{5}W$$

and a position separated from the first side surface of the light emitting structure by $$\frac{1}{2}W.$$

In yet another embodiment, a light emitting device includes a substrate, a plurality of light emitting cells separated from each other and disposed on the substrate, and a plurality of conductive interconnection layers electrically connecting two neighboring light emitting cells, wherein each of the plurality of light emitting cells includes a light emitting structure including a first conductivity-type semiconductor layer, an active layer and a second conductivity-type semiconductor layer, a first electrode disposed on the first conductivity-type semiconductor layer, a second electrode disposed on the second conductivity-type semiconductor layer, and an etching area, in which the first conductivity-type semiconductor layer is exposed, formed by partially etching the light emitting structure, wherein the light emitting structure further includes a first side surface adjacent to the second electrode and parallel with the second electrode and a second side surface opposite to the first side surface and contacting the etching area, and if a width between the first side surface and the second side surface is defined as W, as seen from the top, the first electrode of one light emitting cell is disposed at the edge of the light emitting cell and the second electrode of another light emitting cell adjacent to the light emitting cell is disposed on a line differing from the line on which the first electrode of the light emitting cell is disposed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting device comprising:
   a substrate;
   a plurality of light emitting cells separated from each other and provided on the substrate, the plurality of light emitting cells including a first light emitting cell and a second light emitting cell, said second light emitting cell neighboring the first light emitting cell;
   a plurality of conductive interconnection layers, wherein a first one of the plurality of conductive interconnection layers electrically contacts the two neighboring light emitting cells,
   wherein each of the plurality of light emitting cells includes a light emitting structure including a first conductivity-type semiconductor layer, an active layer and a second conductivity-type semiconductor layer, a first electrode on the first conductivity-type semiconductor layer, a second electrode on the second conductivity-type semiconductor layer, and an etching area, in which the first conductivity-type semiconductor layer is exposed, formed by partially etching the light emitting structure, and an insulating layer along a first side surface of the light emitting structure of the first light emitting cell and along a second side surface of the light emitting structure of the second light emitting cell, wherein the second electrode includes a first part disposed in a first direction parallel with the first side surface and a second part disposed in a second direction differing from the first direction, wherein a length of the first part of the second electrode is greater than a length of the second part of the second electrode.

2. The light emitting device according to claim 1, wherein the first one of the plurality of connective interconnect layers extends from the second electrode and along the first side surface of the light emitting structure of the first light emitting cell while on the insulating layer, and the first one of the plurality of conductive interconnect layers extends adjacent to the substrate and then along the second side surface of the light emitting structure of the second light emitting cell while on the insulating layer.

3. The light emitting device according to claim 1, wherein the light emitting structure of the first light emitting cell includes the first side surface adjacent to the second electrode and parallel with the second electrode, and the light emitting structure of the second light emitting cell includes the second side surface opposite to the first side surface of the first light emitting cell and contacting the etching area.

4. The light emitting device according to claim 1, wherein when a width between the first side surface and the second side surface is defined as W from a top view, the second electrode is provided in an area between a position separated from the first side surface of the light emitting structure by ⅕ W and a position separated from the first side surface of the light emitting structure by ½ W.

5. The light emitting device according to claim 1, wherein the first part of the second electrode is disposed in the first direction parallel with the first side surface, and the first one of the plurality of conductive interconnection layers is provided in the first direction.

6. The light emitting device according to claim 1, wherein the first part of the second electrode is provided in the first direction parallel with the first side surface, and at least one of the plurality of conductive interconnection layers is disposed in a second direction differing from the first direction.

7. The light emitting device according to claim 1, wherein one end of the first one of the plurality of conductive interconnection layers overlaps with the second part of the second electrode.

8. The light emitting device according to claim 1, wherein the first one of the plurality of conductive interconnection layers connects the first electrode of one of the two neighboring light emitting cells and the second electrode of the other one of the two neighboring light emitting cells.

9. The light emitting device according to claim 1, wherein the insulating layer electrically isolates the two neighboring light emitting cells.

10. The light emitting device according to claim 1, wherein at least a portion of the second part of the second electrode deviates from the area between the position separated from the first side surface of the light emitting structure by ⅕ W and the position separated from the first side surface of the light emitting structure by ½ W.

11. The light emitting device according to claim 1, wherein the second side surface is disposed at a predetermined angle from the etching area.

12. The light emitting device according to claim 1, wherein the width of a portion of the conductive interconnection layer on the light emitting cell is less than the width of a portion of the conductive interconnection layer disposed between the two neighboring light emitting cells.

13. The light emitting device according to claim 1, wherein the first electrode of the second light emitting cell is provided at an edge of the second light emitting cell.

14. The light emitting device according to claim 13, wherein the second electrode of the first light emitting cell adjacent to the second light emitting cell is provided on a line differing from the line on which the first electrode of the second light emitting cell is disposed.

15. The light emitting device according to claim 5, wherein the first electrode of the second light emitting cell contacting the first one of the conductive interconnection layers disposed in the first direction includes a bent part.

16. The light emitting device according to claim 1, wherein the plurality of conductive interconnection layers are provided in a first direction and a second direction different to the first direction.

17. A light emitting device comprising:
a substrate;
a plurality of light emitting cells separated from each other and provided on the substrate, the plurality of light emitting cells including a first light emitting cell and a second light emitting cell, said second light emitting cell neighboring the first light emitting cell;
a plurality of conductive interconnection layers, wherein a first one of the plurality of conductive interconnection layers electrically contacts the two neighboring light emitting cells, wherein each of the plurality of light emitting cells includes a light emitting structure including a first conductivity-type semiconductor layer, an active layer and a second conductivity-type semiconductor layer, a first electrode on the first conductivity-type semiconductor layer, a second electrode on the second conductivity-type semiconductor layer, and an etching area, in which the first conductivity-type semiconductor layer is exposed, formed by partially etching the light emitting structure, and an insulating layer along a first side surface of the light emitting structure of the first light emitting cell and along a second side surface of the light emitting structure of the second light emitting cell, wherein the second electrode includes a first part in a first direction parallel with the first side surface and a second part in a second direction differing from the first direction, and wherein a length of the first part of the second electrode is greater than a length of the second part of the second electrode, and wherein the light emitting structure of the first light emitting cell includes the first side surface adjacent to the second electrode and parallel with the second electrode, and the light emitting structure of the second light emitting cell includes the second side surface opposite to the first side surface and contacting the etching area, and when a width between the first side surface and the second side surface is defined as W from a top view.

18. A light emitting device comprising:
a substrate;
a plurality of light emitting cells disposed on the substrate, the plurality of light emitting cells including a first light emitting cell and a second light emitting cell;
a plurality of conductive interconnection layers, wherein a first one of the plurality of conductive interconnection layers electrically contacts two neighboring light emitting cells,
wherein each of the plurality of light emitting cells includes a light emitting structure including a first conductivity-type semiconductor layer, an active layer and a second conductivity-type semiconductor layer, a first electrode on the first conductivity-type semiconductor layer, and a second electrode on the second conductivity-type semiconductor layer, and
an insulating layer along a first side surface of the light emitting structure of the first light emitting cell and along a second side surface of the light emitting structure of the second light emitting cell,
wherein when a width between the first side surface and the second side surface is defined as W from a top view, the first electrode of the second light emitting cell is provided at an edge of the second light emitting cell and the second electrode of the first light emitting cell adjacent to the second light emitting cell is provided on a line differing from a line on which the first electrode of the second light emitting cell is provided,
wherein the second electrode includes a first part disposed in a first direction parallel with the first side surface and a second part disposed in a second direction differing from the first direction, and
wherein a length of the first part of the second electrode is greater than a length of the second part of the second electrode.

19. The light emitting device according to claim 18, wherein the light emitting structure of the first light emitting cell includes the first side surface adjacent to the second electrode and parallel with the second electrode, and the light emitting structure of the second light emitting cell includes the second side surface opposite to the first side surface.

20. The light emitting device according to claim 1, wherein the second direction is parallel with the second surface.

* * * * *